United States Patent
Park et al.

(10) Patent No.: US 8,232,800 B2
(45) Date of Patent: Jul. 31, 2012

(54) HIGHER-ORDER GENERALIZED SERIES PARALLEL IMAGING METHOD FOR ACQUIRING HIGH SPATIO-TEMPORAL RESOLUTION FUNCTIONAL MAGNETIC RESONANCE IMAGES

(75) Inventors: HyunWook Park, Daejeon (KR); SungDae Yun, Daegu (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 448 days.

(21) Appl. No.: 12/508,299

(22) Filed: Jul. 23, 2009

(65) Prior Publication Data
US 2010/0171496 A1 Jul. 8, 2010

(30) Foreign Application Priority Data
Jan. 5, 2009 (KR) .................. 10-2009-0000255

(51) Int. Cl.
*G01V 3/00* (2006.01)
(52) U.S. Cl. .................. 324/309; 324/307; 324/314
(58) Field of Classification Search .................. 324/309, 324/307, 314
See application file for complete search history.

(56) References Cited

U.S. PATENT DOCUMENTS

| | | | |
|---|---|---|---|
| 6,784,664 B2* | 8/2004 | Liang et al. | 324/309 |
| 7,202,663 B2* | 4/2007 | Huang | 324/307 |
| 7,592,809 B1* | 9/2009 | King et al. | 324/309 |
| 7,746,070 B2* | 6/2010 | Park et al. | 324/309 |
| 2004/0113614 A1 | 6/2004 | Liang et al. | |

FOREIGN PATENT DOCUMENTS

| | | |
|---|---|---|
| JP | 2008-307357 A | 12/2008 |
| KR | 1020080110316 | 12/2008 |
| WO | WO2006029240 | 3/2006 |

OTHER PUBLICATIONS

Yun,Oh,Han,Park, Integration of Generalized Series and Parallel Imaging for High-Resolution fMRI, Proc. Intl. Soc. Mag. Reson. Med., 2008, p. 2365, 16, Department of Electrical Engineering, Korea Advanced Institute of Science and Technology, Daejeon, Korea, Republic of.
Hernando, Haldar, Liang, Reduced-Encoding MRI Using Higher-Order Generalized Series, 2006, pp. 29-32, IEEE, Illinois.
Yun,Oh,Han,Park, High-Resolution fMRI With Higher-Order Generalized Series Imaging and Parallel Imaging Techniques, Journal, 2009, pp. 924-936, vol. 29, Wiley-Liss Inc.
Xu, Wiener, Aref, Ying, Ji, Liang, Integrating Parallel Imaging With Generalized Series for Accelerated Dynamic Imaging, 2005, pp. 1434-1437 IEEE.
Korean society for human brain mapping, Report vol. 6, No. 2 (Jul. 11, 2008).

* cited by examiner

*Primary Examiner* — Louis Arana
(74) *Attorney, Agent, or Firm* — Cha & Reiter, LLC

(57) ABSTRACT

Disclosed are a high-order generalized series parallel imaging method for acquiring high spatio-temporal resolution functional magnetic resonance images and a sampling method. The higher-order generalized series parallel imaging method for acquiring high spatio-temporal resolution functional magnetic resonance images includes: performing sampling of an input image in k-space; applying a high-order generalized series (HGS) reconstruction procedure to data acquired as the sampling result to acquire a first reconstructed image; and applying a parallel magnetic resonance reconstruction procedure to the first reconstructed image to acquire a second reconstructed image.

9 Claims, 9 Drawing Sheets

(a) (b)

HIGHER-ORDER GENERALIZED SERIES PARALLEL IMAGING METHOD FOR ACQUIRING HIGH SPATIO-TEMPORAL RESOLUTION FUNCTIONAL MAGNETIC RESONANCE IMAGES

This nonprovisional application claims priority under 35 U.S.C. §119(a) to a patent application No. 10-2009-0000255 filed on Jan. 5, 2009 in Korea, the entire contents of which are hereby incorporated by reference.

BACKGROUND OF THE INVENTION

1. Field of the Invention

The present invention relates to magnetic resonance imaging.

2. Description of the Related Art

In recent years, with increased interest in health promotion, there is growing interest in magnetic resonance imaging methods for medical science.

As one of the magnetic resonance imaging methods, a functional magnetic resonance imaging (fMRI) is used to find out which parts of a brain are activated when the brain is visually, aurally, or dynamically spurred. Since the functional magnetic resonance imaging method should acquire variation in an active signal of the brain according to a lapse of time, it requires a rapid time resolution. Conventionally, echo planar imaging (EPI) having a feature of rapid data acquisition has been widely used. However, the echo planar imaging method is reasonably applicable when the size of an image is 64×64. When the size of the image is larger than 64×64, since a signal to noise ratio is reduced, the echo planar imaging method may not be used.

Acquisition speed of data by the EPI is faster than as compared with other magnetic resonance imaging methods. However, ghost artifacts, geometric distortion, and the like occur. Such problems significantly affect on a magnetic resonance imaging system with high magnetic field strength.

Now, the magnetic resonance imaging has been developed to higher magnetic field strength. Further, an extremely high magnetic field system applicable to 7.0 Tesla (T) is in progress for common use. Current hospitals or research institutes have mainly used the magnetic resonance imaging system with a strength of 1.5 T or 3.0 T, and the functional magnetic resonance imaging method is applied with the strength of 1.5 T or 3.0 T. However, as the magnetic resonance imaging is applied with an extremely high magnetic field, it becomes difficult to perform the functional magnetic resonance imaging method using the EPI. Accordingly, there is a strong demand for conventional magnetic resonance imaging other than the EPI capable of increasing data acquisition speed.

Although a data acquisition speed of a conventional magnetic resonance imaging is slower as compared with the EPI, an occurrence frequency of ghost artifacts or geometric distortion is very low. As a result, it may be readily applicable to an extremely high magnetic field system. Consequently, if the data acquisition speed of the conventional magnetic resonance imaging method is increased, the magnetic resonance imaging method applicable to an extremely high magnetic field may be utilized.

There are various methods to improve the processing speed of the conventional magnetic resonance imaging. Firstly, parallel magnetic resonance imaging is one method for improving a speed of the conventional magnetic resonance imaging, and performs sampling with intermittent rate lower than a Nyquist rate in k-space to acquire data for reconstruction of an image. In such parallel magnetic resonance imaging, the imaging speed may be increased. However, because the imaging speed is proportional to the channel number of used coils, it is difficult to perform a high resolution MRI.

Secondly, a generalized series imaging method is one method for improving a speed of the conventional magnetic resonance imaging, and is mainly used to acquire a magnetic resonance image with high time resolution. The generalized series imaging method performs sampling restrictedly with a Nyquist rate with respect to a low frequency band of a central part in k-space to acquire data for reconstruction of an image. Namely, the generalized series imaging method uses the supposition that images positioned in adjacent frames are similar to each other.

The series imaging method is a method for increasing imaging speed. However, because a speed rate capable of the imaging speed is limited, it is not suitable to perform a high resolution functional magnetic resonance imaging method. The performance of a reconstruction algorithm in the generalized series imaging method is lower than that of a higher-order generalized imaging method.

Finally, a higher-order generalized series imaging method is one method for improving a speed of the conventional magnetic resonance imaging, which is a method changed from the generalized series imaging method. A data acquisition manner of the higher-order generalized series imaging method is the same as that of the generalized series imaging method. A performance of a reconstruction algorithm in the higher-order generalized series imaging method is better than that of the generalized series imaging method. Although the high resolution generalized series imaging method may acquire a reconstruction image of high quality, time resolution is not improved. Accordingly, it is difficult to perform the high resolution functional magnetic resonance imaging by only a higher-order generalized series imaging.

Meanwhile, there is an imaging method proposed by Xu as the combination of the parallel magnetic resonance imaging and the generalized series imaging.

FIG. 1 is a view illustrating a sampling procedure of a magnetic resonance imaging method proposed by Xu.

As shown in FIG. 1, in the sampling step of a conventional magnetic resonance imaging method, M lines are sampled at a central part with k-space with a Nyquist rate, and outer parts except for the central part are intermittently sampled with a reduction factor R by a parallel magnetic resonance imaging method.

In FIG. 1, a left part is a conventional imaging method illustrating k-space sampling used to acquire a reference image. A right part is a method proposed by Xu illustrating k-space sampling used upon photographing of a real dynamic magnetic resonance image.

A procedure of reconstructing an image based on data acquired by such sampling will now be described. A generalized series imaging method is applied using M lines of a central part to make an image. In this case, in the same manner for a parallel imaging method, because a multi-channel coil referred to herein as phased array coil is used, this procedure is repeated the same times as the number of channels. Next, a sum of squares in an image acquired from each channel is obtained to obtain an initial estimate of an image to be finally reconstructed. Further, sensitivity encoding (SENSE) using Tikhonov regularization is applied to reconstruct an image to further improve the initial estimate.

However, such a sampling procedure is not a fundamental approach capable of increasing a time resolution. The quality of a reconstructed image from Xu's method may be better than that of each of the parallel magnetic imaging method and the generalized series imaging method. However, the Xu's imaging method has a disadvantage that a time resolution thereof is lower than that of each of the parallel magnetic imaging method and the generalized series imaging method.

SUMMARY OF THE INVENTION

The present invention has been made in view of the above problems, and it is an object of the present invention to provide a high-order generalized series parallel imaging method for acquiring high spatio-temporal resolution functional magnetic resonance images, in which an image acquisition time may be reduced as compared with a parallel magnetic resonance imaging method or a higher-order generalized series method using a combination of an image shortening manner of the parallel magnetic resonance imaging and an image shortening manner of a higher-order generalized series imaging.

In accordance with an exemplary embodiment of the present invention, there is provided a higher-order generalized series parallel imaging method for acquiring high spatio-temporal resolution functional magnetic resonance images comprising: performing sampling of an input image in k-space; applying a high-order generalized series (HGS) reconstruction procedure to data acquired as the sampling result to acquire a first reconstructed image; and applying a parallel magnetic resonance reconstruction procedure to the first reconstructed image to acquire a second reconstructed image.

In accordance with another embodiment of the present invention, there is provided a higher-order generalized series parallel imaging method for acquiring high spatio-temporal resolution functional magnetic resonance images comprising: performing sampling of an input image in k-space; applying a parallel magnetic resonance reconstruction procedure to data acquired as the sampling result to acquire a first reconstructed image; and applying a high-order generalized series (HGS) reconstruction procedure to the first reconstructed image to acquire a second reconstructed image.

The sampling step may include restrictedly sampling a central part of the k-space to acquire data with a rate lower than a Nyquist rate.

In a case that the sampling number is N when sampling is performed with the Nyqust rate, the sampling number $N_{tot}$ of the sampling step may be expressed by $N_{tot}=N/R_{tot}$, $R_{HGS}=N/N_{GS}$ and $R_P=N/N_P$, where $N_{GS}$ and $N_P$ are the sampling number when data are acquired by the generalized series imaging procedure and the parallel magnetic resonance imaging procedure.

The step of applying the parallel magnetic resonance reconstruction procedure may further include performing regularization.

The step of applying the higher-order generalized series reconstruction procedure may further include performing regularization.

The parallel magnetic resonance imaging procedure is sensitivity profiles from an array of coils for encoding and reconstruction in parallel (SPACE RIP), sensitivity encoding (SENSE), partially parallel imaging with localized sensitivities (PILS), or generalized auto-calibrating partially parallel acquisitions (GRAPPA).

In accordance with a further embodiment of the present invention, there is provided a method for sampling input images in k-space to acquire data comprising the step of: restrictedly sampling a central part of the k-space to acquire the data with a rate lower than a Nyquist rate.

In a case that the sampling number is N when sampling is performed with the Nyqust rate, the sampling number $N_{tot}$ of the sampling step may be expressed by $N_{tot}=N/R_{tot}$, $R_{HGS}=N/N_{GS}$ and $R_P=N/N_P$, where $N_{GS}$ and $N_P$ are the sampling number when data are acquired by the generalized series imaging procedure and the parallel magnetic resonance imaging procedure.

In a high-order generalized series parallel imaging method for acquiring high spatio-temporal resolution functional magnetic resonance images in accordance with the present invention, an image acquisition time may be reduced as compared with a parallel magnetic resonance imaging method or a higher-order generalized series method using a combination of an image shortening manner of the parallel magnetic resonance imaging and an image shortening manner of a higher-order generalized series imaging.

BRIEF DESCRIPTION OF THE DRAWINGS

The objects, features and advantages of the present invention will be more apparent from the following detailed description in conjunction with the accompanying drawings, in which.

DETAILED DESCRIPTION OF EXEMPLARY EMBODIMENTS

Figure 1:
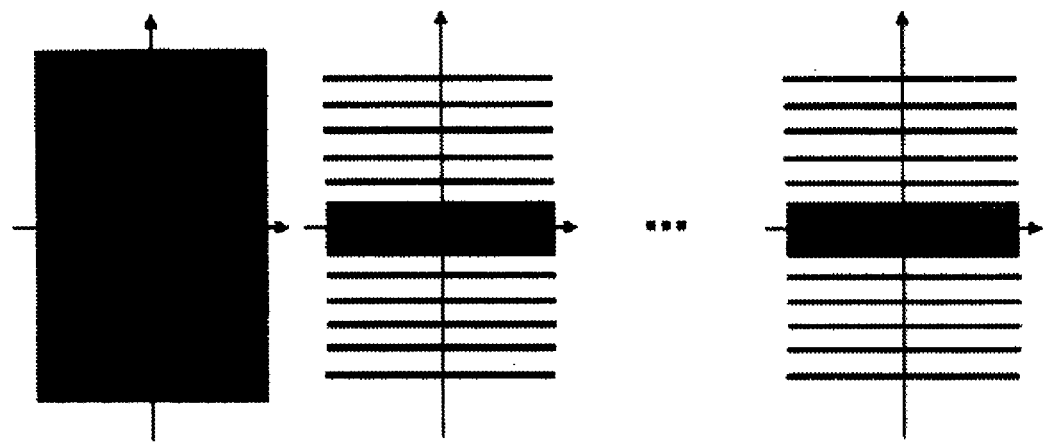
FIG. 1 is a view illustrating a sampling procedure of a magnetic resonance imaging method proposed by Xu.

The present invention relates to a data sampling and reconstructing procedure using a higher-order generalized series parallel imaging method for acquiring high spatio-temporal resolution magnetic resonance images. More particularly, the present invention relates to a high-order generalized series parallel imaging method for acquiring high spatio-temporal resolution functional magnetic resonance images, in which an image acquisition time may be reduced as compared with a parallel magnetic resonance imaging method or a higher-order generalized series method using a combination of an scanning-time reducing manner of the parallel magnetic resonance imaging and a higher-order generalized series imaging.

Hereinafter, specific embodiments of the present invention are described in detail referring to the accompanying drawings. The embodiments will be described in detail so that those skilled in the art may easily use the present invention. It should be understood that various embodiments of the present invention are unnecessarily exclusive of each other although they are different from each other. For example, specific shapes, structures, and features disclosed herein may be embodied by other embodiments without departing from the true spirit and scope of the invention. Further, it should be understood that positions or arrangements of respective structural elements in the embodiments disclosed herein may be modified without departing from the true spirit and scope of the invention. Accordingly, the invention is to cover all modifications, equivalents and alternatives falling as defined by the appended claims. The same reference numerals are used throughout the drawings to refer to the same or like parts. Detailed descriptions of well-known functions and structures incorporated herein may be omitted to avoid obscuring the subject matter of the present invention.

Hereinafter, Hereinafter, exemplary embodiments of the present invention will be described in detail with reference to the accompanying drawings.

PREFERRED EMBODIMENT OF THE PRESENT INVENTION

A magnetic resonance image is acquired by sampling a k-space region and performing Fourier transformation thereof.

Figure 2:
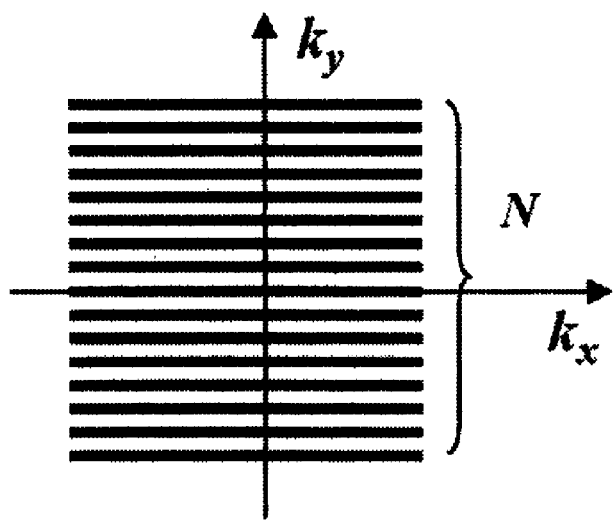
FIG. 2 is a view illustrating a conventional sampling fashion.

FIGS. 2 to 5 are views illustrating a sampling procedure in accordance with the present invention. FIG. 2 is a view illustrating a conventional sampling method. Data are acquired with a Nyquist rate by such sampling fashion. Meanwhile, as shown in FIG. 2, a total area of the k-space should be closely sampled, such that it takes a long time to perform the sampling. In this case, it is assumed that the sampling number is N.

Figure 3:
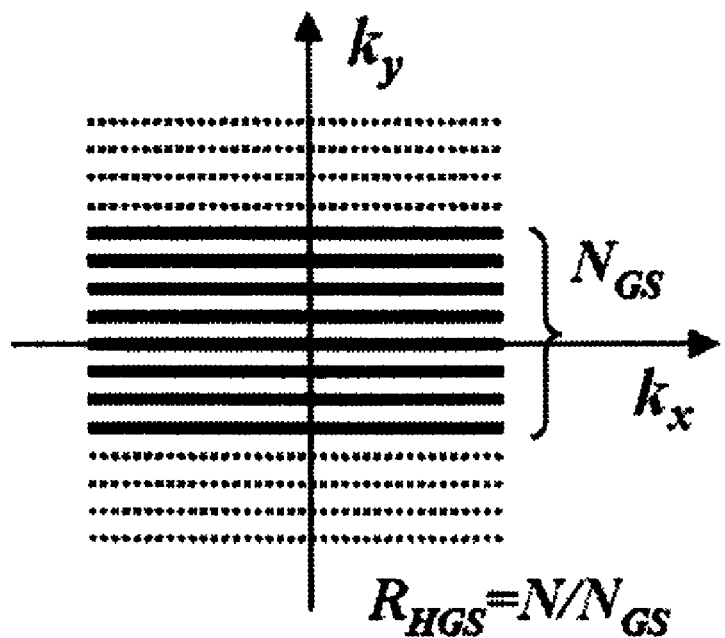
FIG. 3 is a view illustrating a sampling fashion used when magnetic resonance images are acquired by a generalized series imaging method or a higher-order generalized series imaging method.

FIG. 3 is a view illustrating a sampling fashion used when magnetic resonance images are acquired by a generalized series (GS) imaging or a higher-order generalized series (HGS) imaging. The generalized series (GS) imaging and the higher-order series (HGS) imaging have substantially the same image acquisition scheme. What is different from each other is a reconstruction algorithm. Images reconstructed by the BGS imaging are finer as compared with those of the GS imaging.

In the sampling fashion, as shown in FIG. 3, in a total area of the k-space, a low frequency band less than a predetermined frequency, namely, a central part of k, axis is restrictedly sampled with a Nyquist rate. Namely, the sampling fashion shown in FIG. 3 has the sampling number of $N_{GS}$, and may be performed $R_{BGS}$ (=$N/N_{GS}$) times faster than the sampling fashion shown in FIG. 2. In this case, the $N_{GS}$ is a value that a user may select. When the $N_{GS}$ is reduced, a data acquisition time may be reduced but a quality of reconstruction images is gradually deteriorated. In such a sampling fashion, because only a lower frequency band is sampled, it is not understood that high frequency components of an image are lost. Accordingly, such a sampling fashion is widely used to reduce an image acquisition time by sampling only concentrated low frequency parts of image information using a fact that images positioned in adjacent frames are similar to each other at the acquisition time of dynamic MRI images.

Figure 4:
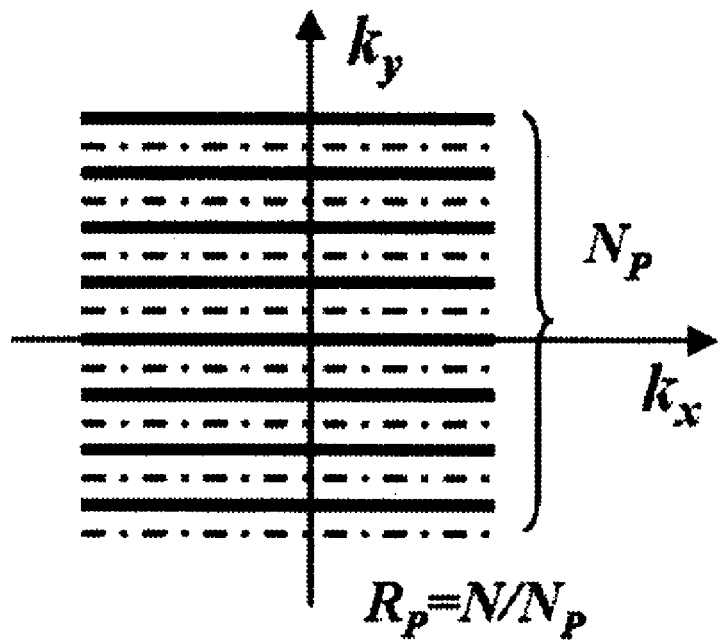
FIG. 4 is a view illustrating a sampling fashion used when magnetic resonance images are acquired by a parallel magnetic resonance imaging method.

FIG. 4 is a view illustrating a sampling fashion used when magnetic resonance images are acquired by a parallel magnetic resonance imaging (MRI). The sampling fashion shown in FIG. 4 has the sampling number of $N_P$, and may be performed $R_P$ (=$N/N_P$) times faster than the sampling fashion shown in FIG. 2. However, because sampling is not performed with a Nyquist rate, aliasing occurs. In comparison with FIG. 3, in the sampling fashion of FIG. 4, it is understood that sampling is not performed in only central parts but the sampling is sparsely performed. In the parallel magnetic resonance imaging method, a suitable process is carried out by using additional data measured through a plurality of multi-channel coils to remove the aliasing. Because the method for removing the aliasing is a prior art, a detailed description thereof is omitted in the specification. Meanwhile, in the parallel magnetic resonance imaging method, a sampling rate, that is, an intermittent sampling rate is proportional to the channel number of multi-channel RF coils. Accordingly, the greater the channel number of used coils is, the higher an imaging speed is.

Figures 5, 6:
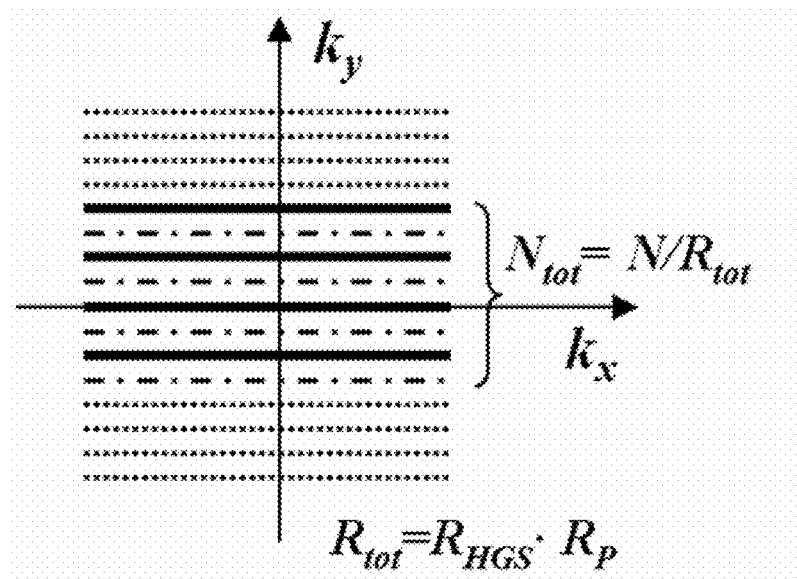
FIG. 5 is a view illustrating a sampling fashion of the imaging method in accordance with an embodiment of the present invention.
FIG. 6 is a view illustrating a matrix equation for reconstructing one column in an SPACE RIP.

FIG. 5 is a view illustrating a sampling fashion of the imaging method in accordance with an embodiment of the present invention. The sampling fashion of FIG. 5 uses a combination of the sampling fashion used upon acquisition of data using the higher-order generalized series imaging shown in FIG. 3 and the sampling fashion used upon acquisition of data using the parallel magnetic resonance imaging method shown in FIG. 4. As shown in FIG. 5, in the sampling fashion, a central part of the k-space, that is, a frequency band less than a predetermined specific frequency is restrictedly sampled to acquire data with as much as a rate lower than the Nyquist rate. The sampling fashion shown in FIG. 5 has the sampling number of $N_{tot}$, and may be performed $R_P$=$N/(R_{BGS} \cdot R_P)$ times faster than the sampling fashion shown in FIG. 2.

The present invention may reduce a data acquisition time in the sampling fashion as described above.

A data acquisition scheme and an image reconstruction scheme will be described in detail below.

Data Acquisition Scheme

Magnetic resonance image data may be initially acquired by performing sampling in k-space. An image reconstruction result through the following Fourier transformation may vary depending on the type of a sampling fashion.

The data acquisition scheme through sampling in accordance with an embodiment of the present invention is explained with reference to FIG. 5. Namely, central parts of the k-space are restrictedly sampled, which is a feature of the higher-order generalized series imaging. Data acquisition is performed with a rate lower than the Nyquist, which is a feature of the parallel magnetic resonance imaging.

In FIG. 5, dashed lines cenote sampling lines excluded by the higher-order generalized series imaging method, and chain lines denote sampling lines excluded by the parallel magnetic resonance imaging.

Parallel Magnetic Resonance Imaging and Regularization

There are sensitivity profiles from an array of coils for encoding and reconstruction in parallel (SPACE RIP), sensitivity encoding (SENSE), partially parallel imaging with localized sensitivities (PILS), and generalized auto-calibrating partially parallel acquisitions (GRAPPA) as an example of the parallel magnetic resonance imaging method.

Here, the SPACE RIP will now be described by way of example. The SPACE RIP is characterized that images are reconstructed column by column. Unlike other parallel magnetic resonance imaging method, the SPACE RIP is advantageous in that is it unnecessary to sample the k-space at the same intervals. That is, there is important information of images in a lower frequency part. Sparse sampling may be performed in the lower frequency region but intermittent sampling may be performed in a higher frequency part at optional intervals.

As a result, although data are acquired for the same time (x), high-quality images may be obtained.

In the specification, for the purpose of convenience of the description, the SPACE RIP has been described using a sampling fashion of a interval by way of example. However, a sampling fashion of an optional interval may be used. As illustrated earlier, the use of the sampling fashion of a different interval leads to improvement in a performance.

In an embodiment of the present invention, the utilization of regularization together with the SPACE RIP improved the quality of constructed images.

The following is a detailed description of an image reconstruction procedure of the SPACE RIP.

First, a coil with a sensitivity profile $W_k(x, y)$ receives an MR signal, which may be expressed by a following equation 1.

$$s_k(G_y^g, t) = \iint r(x,y) W_k(x,y) \exp\{i\gamma(G_x xt + G_y^g y\tau)\} dx dy \quad \text{[Equation 1]}$$

Fourier transform of the equation 1 in an x direction is performed to obtain the following equation 2.

$$S_k(G_y^g, x) = \int r(x,y) W_k(x,y) e^{i\gamma(G_y^g y\tau)} dy \quad \text{[Equation 2]}$$

The equation 2 may be again written as the following equation 3 by using a spanning equation in a discrete domain.

$$S_k(G_y^g, x) = \sum_{n=1}^{N} \rho(x, n) W_k(x, n) e^{i\gamma(G_y^g n\tau)} \quad \text{[Equation 3]}$$

$$S_k(G_y^g, x) = \sum_{n=1}^{N} \rho(x, n) W_k(x, n') e^{i\gamma(G_y^g n'\tau)} \int \Omega_n(y) \Omega_{n'}(y) dy$$

The equation 3 may be again written as a following equation 4 by using an orthonormal property.

$$\int \Omega_n(y) \Omega_{n'}(y) dy = \delta(n, n') \quad \text{[Equation 4]}$$

$$\therefore S_k(G_y^g, x) = \sum_{n=1}^{N} \rho(x, n) W_k(x, n) e^{i\gamma(G_y^g n\tau)}$$

The equation 4 may be expressed by a matrix equation as shown in FIG. 6. When solving the equation 4, a ρ vector may be obtained as expressed by the following equation 5, which is a final step of the SPACE RIP.

$$s = W\rho \quad \text{[Equation 5]}$$

$$t_\rho = W^{-1} s$$

The condition number r is a ratio of the largest value of singular values of the matrix and the smallest value of singular values of the matrix. When the condition number r is very large, the ill-posed problem occurs. Regularization is a method for solving the ill-posed problem. When solving a matrix equation, namely, $s=W\rho$, a stable solution of ($\rho=W^{-1}s$) is not obtained using the equation. However, regularization is a method in that the solution is obtained by applying a condition term as illustrated in the following equation 6 to improve the stability of a matrix system. This enables a robust reconstruction to be achieved.

$$\min_\rho\{\|W\rho - s\|^2 + \lambda^2 \|I\rho\|^2\} \quad \text{[Equation 6]}$$

An explicit Solution of the equation 6 is written as the following equation 7, λ is a regularization variable that may vary depending on a matrix system, and I is an identity matrix.

$$\therefore \rho = \{W^T W + \lambda^2 I\}^{-1} A^T s \quad \text{[Equation 7]}$$

Generalized Series Imaging (GS)

When an optional high resolution reference image $I^{(ref)}$ (x, y) is given, in the generalized series imaging, a function as expressed by the following equation 8 is used as a basis function.

$$\phi_n(x,y) = I^{(ref)}(x,y) e^{j2\pi k_n y} \quad \text{[Equation 8]}$$

Meanwhile, an image to be reconstructed is expressed in a linear combination form of the basis function as illustrated in the following equation 9.

$$I^{(GS)}(x, y) = \sum_n c_n(x) \varphi_n(x, y) \quad \text{[Equation 9]}$$

$$= I^{(ref)}(x, y) \sum_n c_n(x) e^{j2\pi k_n y},$$

$$0 \leq n \leq N_{GS} - 1$$

In the equation 9, $N_{GS}$ represents the phase encoding number used in the generalized series imaging. In the equation 9, data are acquired with a Nyquist sampling rate, in which the generalized series imaging is applied in only a y axis direction, namely, in a phase encoding direction, but is not applied in an x axis direction. That is, a Nyquist rate sampling fashion to the x axis direction is expressed as illustrated in FIG. 3. In equation 9, a coefficient $c_n(x)$ may be obtained based on a Fourier transform of an acquired image. When the coefficient $c_n(x)$ is obtained, $I^{(GS)}(x,y)$ may be calculated therefrom. This means that an image reconstruction is terminated.

In order to calculate the coefficient $c_n(x)$, $d(x,k_m)$ is defined. In this case, the $d(x,k_m)$ is a result obtained by performing 1-D direction Fourier transformation of 2-D k space data in an x axis.

$$d(x, k_m) = \sum_y I^{(GS)}(x, y) e^{-j2\pi k_m y} \quad \text{[Equation 10]}$$

A combination of the equation 9 and the equation 10 provides a relational expression like the following equation 11.

$$d(x, k_m) = \sum_n c_n(x) d^{(ref)}(x, k_m - k_n), \quad \text{[Equation 11]}$$

$$0 \leq n \leq N_{GS} - 1$$

Here, $d^{(ref)}(x,k_m)$ is a result obtained by performing 1-D direction Fourier transformation of 2-D k-space data of reference data in the x axis. Since both of $d(x,k_m)$ and $d^{(ref)}(x,k_m)$ are known, the coefficient $c_n(x)$ may be calculated based on them.

The equation 11 may be expressed in a single matrix equation as the equation 12. In this case, $d^{(ref)}(x,k_m-k_n)$ is the (m, n)-th term of an H matrix.

$$d=Hc \quad \text{[Equation 12]}$$

Higher-Order Generalized Series Imaging (HGS)

The generalized series imaging method has a limitation in that new optional information other than reference data should be inserted to reconstruct an image. This means that there are no new data except for only data in a center region of the k-space. Namely, as illustrated in the equation 9, are constructed image is obtained by multiplying the reference data by a contrast modulation function (CMF) as described below.

$$CMF(x, y) = \sum_n c_n(x)e^{j2\pi k_n y}, 0 \le n \le N_{GS} - 1 \quad \text{[Equation 13]}$$

The higher-order generalized series imaging described herein is implemented by adding a high frequency component term to the CMF in the generalized series imaging. That is, a reconstructed image achieved by the higher-order generalized series imaging may be expressed by the following equation 14.

$$I^{(HGS)}(x, y) = I^{(ref)}(x, y)\sum_n c_n(x)e^{j2\pi k_n y}, \quad \text{[Equation 14]}$$
$$0 \le n \le N_{HGS} - 1$$

Here, $N_{HGS}$ has a value greater than that of $N_{GS}$. Although the sampling number of really acquired data is only $N_{GS}$, the higher-order generalized series imaging method calculates the same number of the coefficient $c_n(x)$ as the number of $N_{HGS}$ greater than $N_{GS}$.

As a result, it means that an estimation procedure should be performed. In this case, the estimation procedure uses regularization based on a total variation technique as follows.

$$c(x) = \underset{c(x)}{\operatorname{argmin}}[\|Hc(x) - d\|_2^2 + \lambda_{HGS}^2\|Bc(x) - r\|_1] \quad \text{[Equation 15]}$$

Upon obtaining the coefficient $c_n(x)$, when there is only the first term in the equation 15, it becomes the generalized series imaging. When there is the second term as well as the first term in the equation, it becomes the higher-order generalized series imaging. In this case, $B=\Lambda_{ref}DF$, and r may be zero or a reference data value. Further, F is a CMF function, D is a finite difference operator, $\Lambda_{ref}$ is a diagonal matrix, and elements thereof are composed of reference data. A finite difference means a difference between two adjacent data, which is a term defined in discrete mathematics.

An image is reconstructed by the coefficient $c_n(x)$ using the foregoing algorithm. Accordingly, the present invention may achieve finer reconstruction as compared with the generalized series imaging method although it uses the same data.

Image Reconstruction Scheme of the Present Invention

As discussed above, a data acquisition procedure uses the sampling fashion as shown in FIG. 5. The following is an explanation of a procedure reconstructing data acquired in the sampling fashion shown in FIG. 5.

Figure 7:
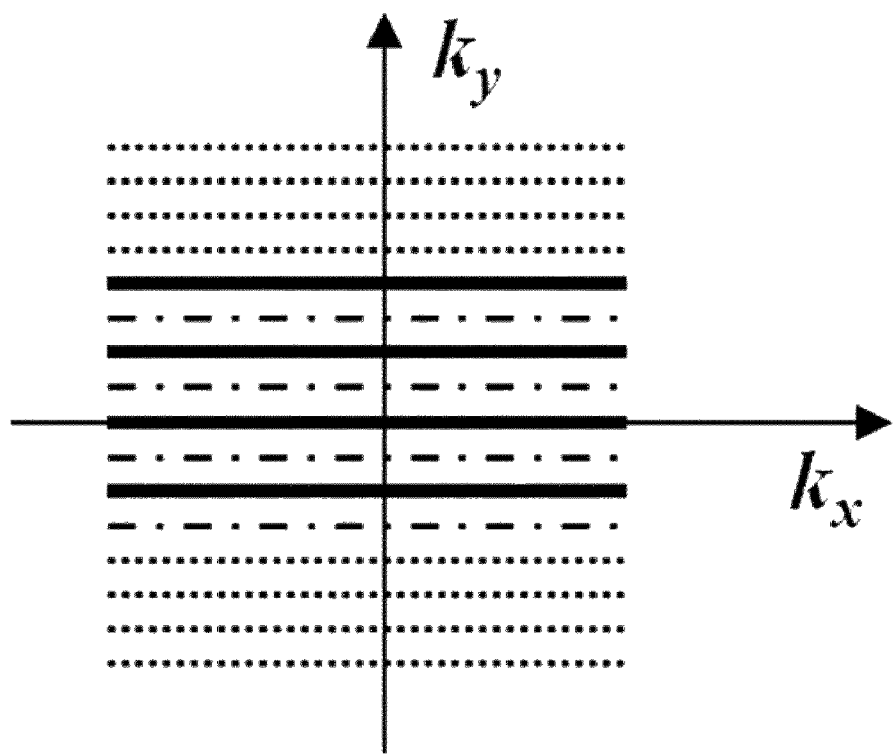
FIG. 7 through FIG. 9 are views illustrating a procedure of reconstructing data acquired by the sampling fashion shown in FIG. 5.
Figure 8:
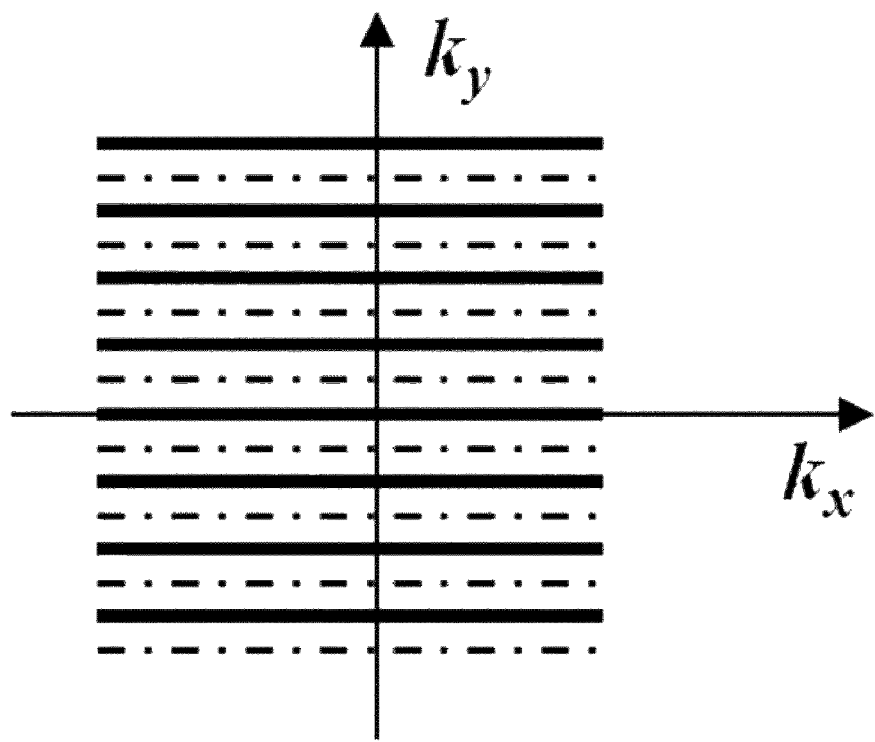
Figure 9:
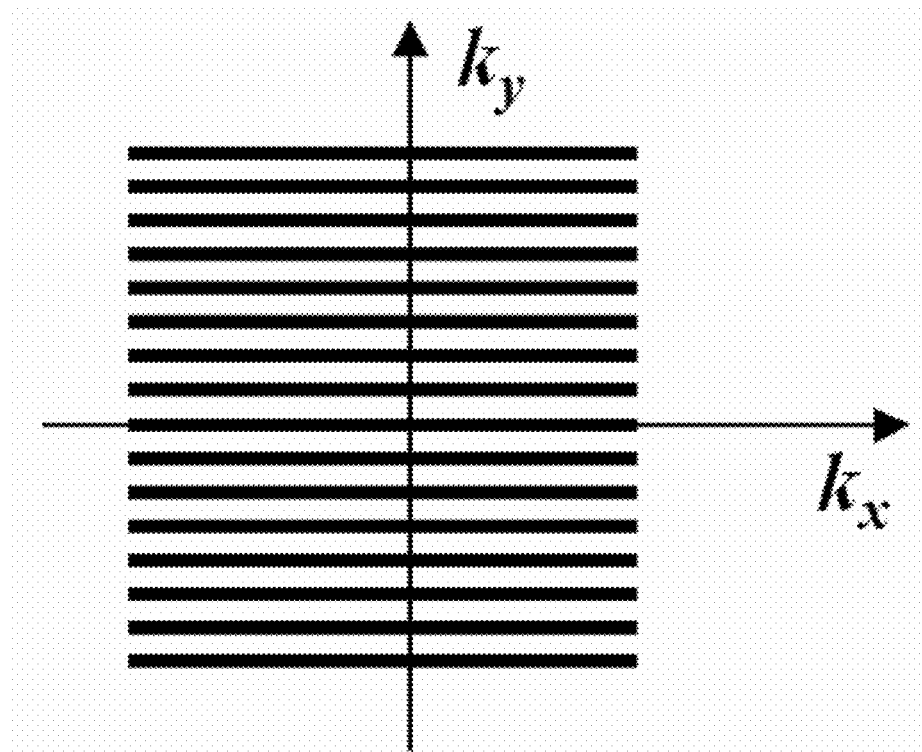

FIG. 7 through FIG. 9 are views illustrating a procedure of reconstructing data acquired by the sampling fashion shown in FIG. 5.

First, a higher-order generalized series imaging method is applied for the data reconstruction. Namely, a k-line shown in FIG. 7 is filled with lines of an outer part, namely, a frequency band higher than a predetermined frequency not acquired by sampling. In the higher-order generalized series imaging method, data shown in FIG. 8 may be acquired from data of FIG. 7. That is, there exists data in an outer part of the k-space as well as a central part thereof. Regularization may be performed for robust reconstruction. Through such procedures, data of a form to which parallel magnetic resonance imaging may be applied is acquired.

Next, the SPACE RIP being a type of the parallel magnetic resonance imaging is applied to data shown in FIG. 8 together with regularization, thereby acquiring a final reconstruction image. Since the SPACE RIP is explained above, the description thereof is omitted.

The embodiment of the present invention has been described such that the higher-order generalized series imaging method and the parallel magnetic resonance imaging method are sequentially performed. However, the image reconstruction procedure is not limited thereto. After the parallel magnetic resonance imaging method, the higher-order generalized series imaging method may be carried out.

Performance Test

Distinct features of a method for reconstructing images by a combination of a higher-order generalized series imaging and a parallel magnetic resonance imaging from other techniques will now be explained with reference to various actually performed tests.

Two-Dimensional (2-D) Simulation Phantom

Inventors of the present invention compared and analyzed a reconstruction performance and spatio-temporal resolution between the present invention and other techniques using a 2-D simulation phantom.

Figure 10:
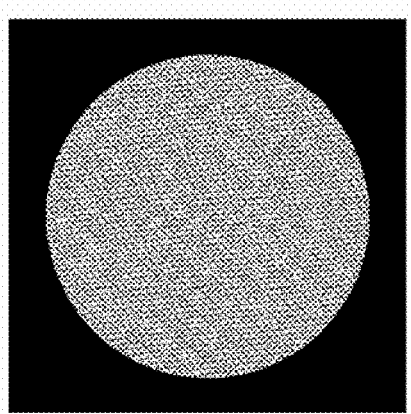
FIG. 10 is a view illustrating a two-dimensional simulation phantom used to test a performance of the method in accordance with an embodiment of the present invention.
Figure 10:
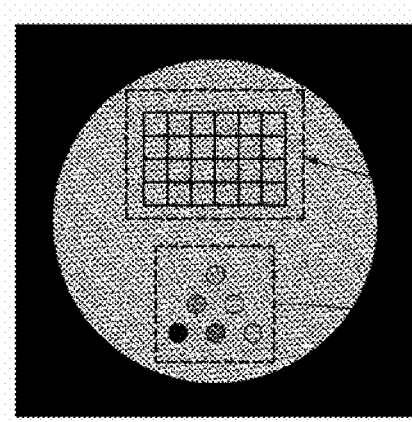

FIG. 10 is a view illustrating a two-dimensional simulation phantom used to test a performance of the method in accordance with an embodiment of the present invention.

FIG. 10(a) shows a reference image and FIG. 10(b) shows a dynamic image. The dynamic image further contains dynamic characteristics region 1001, 1002 in comparison with the reference image. From FIG. 10, it may be estimated that an entire Fourier component may be reconstructed although the reference image has whole/entire Fourier components and the dynamic image has only a part of main components of the Fourier components. This is a fundamental principle used in higher-order generalized series imaging.

Inventors set the reference image to have the entire Fourier components and the dynamic image to have only a part of the Fourier component. The part of the Fourier component contained in the dynamic image is sampled in a fashion shown in FIG. 3, FIG. 4, or FIG. 5.

Figure 12:
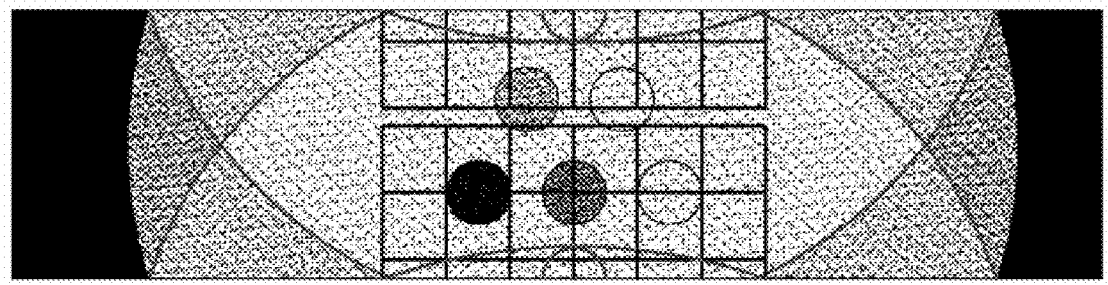

First, when data are sampled in a fashion shown in FIG. 3, namely, a higher-order generalized series imaging method in a state that $R_{HGS}=4$ to reconstruct an image, the reconstructed image is acquired to have an appearance as shown in FIG. 12.

Figure 13:
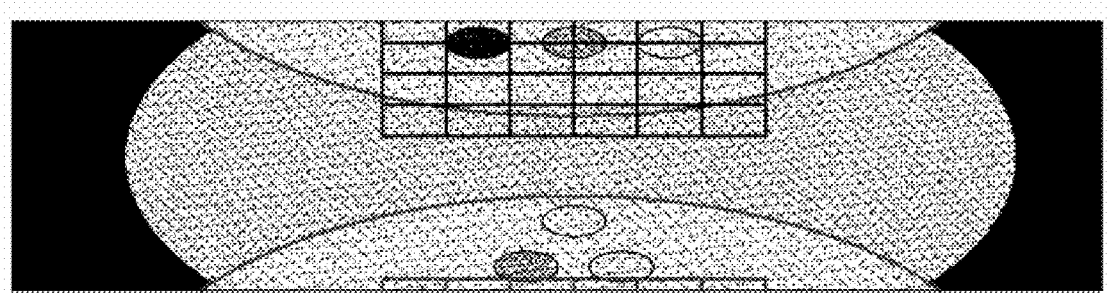

When an image is reconstructed in a fashion shown in FIG. 4, that is, a magnetic resonance imaging method in a state that $R_P=4$ to reconstruct an image, the reconstructed image is acquired to have an appearance as shown in FIG. 12. Further, when an image is reconstructed in a fashion shown in FIG. 5, that is, a magnetic resonance imaging method in a state that $R_{tot}=R_{HGS}\cdot R_P=2\cdot2=4$ to reconstruct an image, the reconstructed image is acquired to have an appearance as shown in FIG. 13. Meanwhile, simulation data are produced to have four channels, and each image is an average of 4 channel data.

Figure 11:
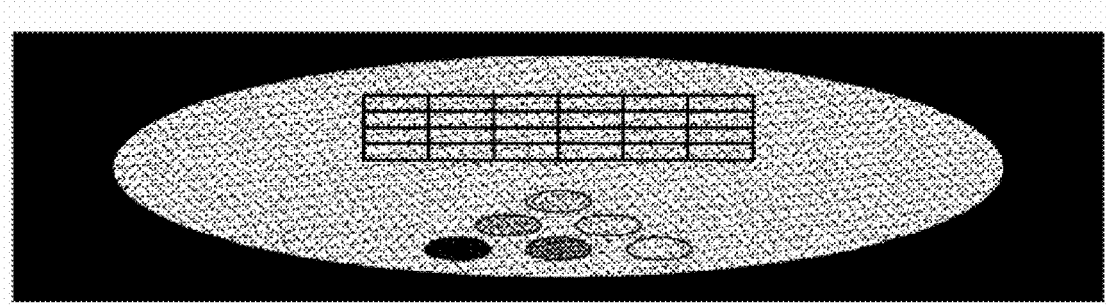
FIG. 11 through FIG. 13 are views illustrating images reconstructed by the sampling fashions shown in FIG. 3 through FIG. 5, respectively.
Figure 14:
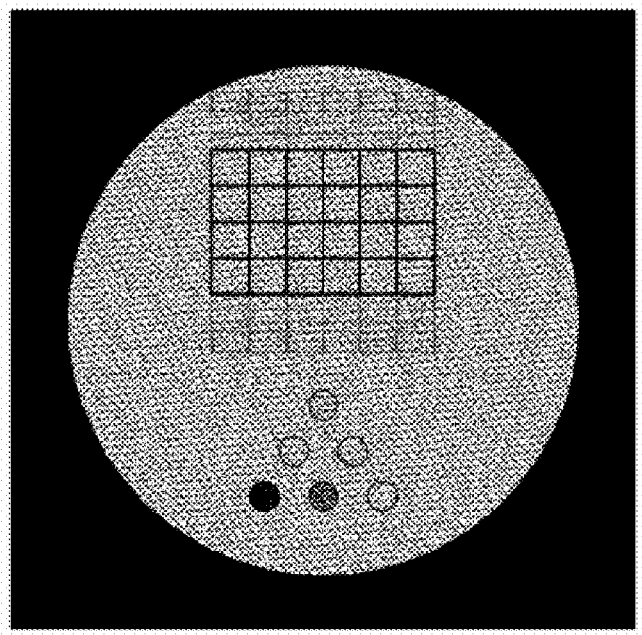
FIG. 14 through FIG. 16 are views illustrating results obtained by reconstructing the images of FIG. 11 through FIG. 13, respectively.
Figure 15:
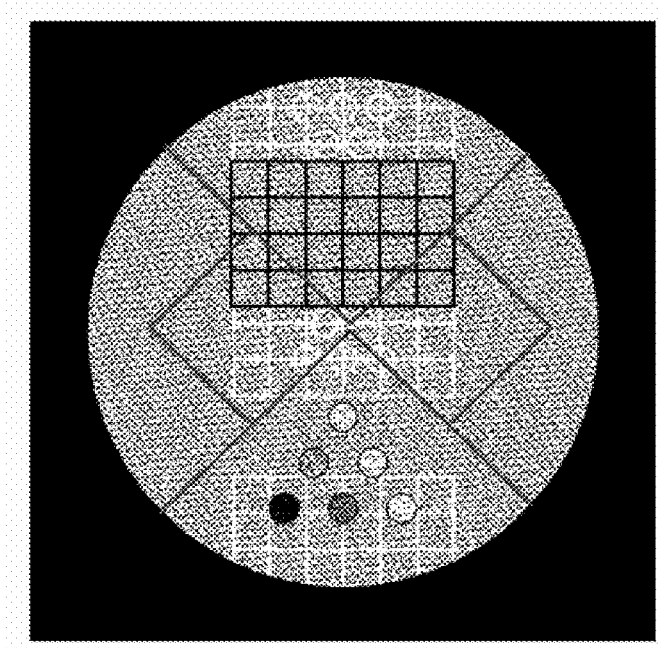
Figure 16:
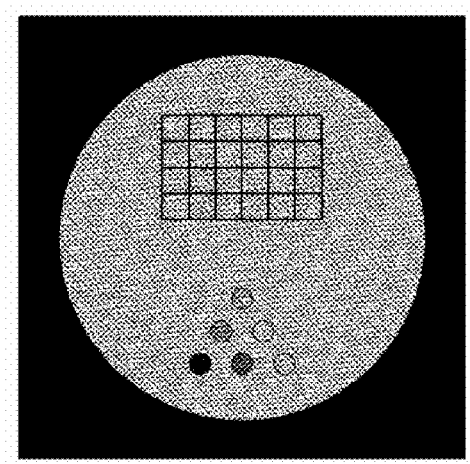

When the higher-order generalized series reconstruction, the parallel magnetic resonance reconstruction, and an image reconstruction algorithm according to the imaging method of the present invention are respectively applied to images shown in FIG. 11 to FIG. 13, images shown in FIG. 14 to FIG. 16 may be acquired. FIG. 11 through FIG. 13 are views illustrating images reconstructed by the sampling fashion shown in FIG. 3 through FIG. 5, respectively. FIG. 14 through FIG. 16 are views illustrating results obtained by reconstructing the images of FIG. 11 through FIG. 13, respectively.

From the foregoing simulations, the higher-order generalized series imaging method, the parallel magnetic resonance imaging method, and the imaging method of the present invention have the same time resolution, namely, may equally acquire data four times faster than that of the conventional imaging method shown in FIG. 2. However, as illustrated in FIG. 14 to FIG. 16, the present invention may obtain the best result in the quality of a constructed image among the three imaging methods.

Performance Comparison of Generalized Series Imaging Method and Higher-Order Generalized Series Imaging Method Inventers compared performances of the higher-order generalized series imaging method of the present invention and the generalized series imaging method using 1-D simulation data.

Figure 17:
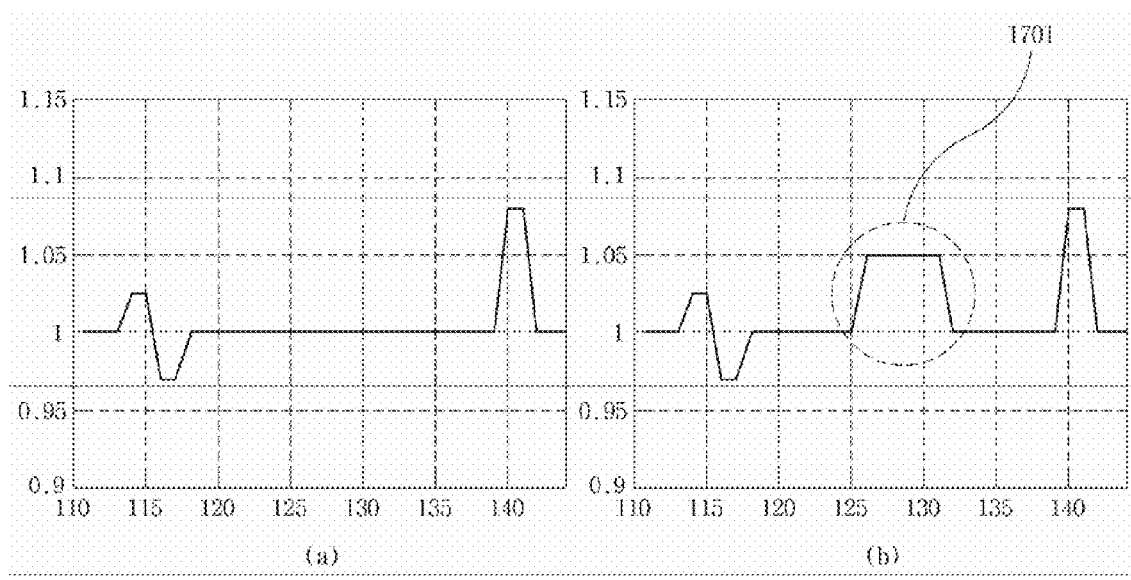
FIG. 17 is a view illustrating one-dimensional simulation data used for comparing a performance of generalized series imaging method with that of higher-order generalized series imaging method.

FIG. 17 is a view illustrating one-dimensional simulation data used for comparing a performance of a generalized series imaging method with a performance of a higher-order generalized series imaging method.

FIG. 17 is a graph illustrating a 1-D simulation signal. A left graph (a) illustrates a reference signal and a right graph (b) illustrates a dynamic signal.

As shown in FIG. 17, a dynamic characteristic in the dynamic signal is a square part 1701 in a center of the graph. A length of real data is 256. However, among them, only parts indicating the dynamic characteristic are magnified and expressed in FIG. 17.

Figure 18:
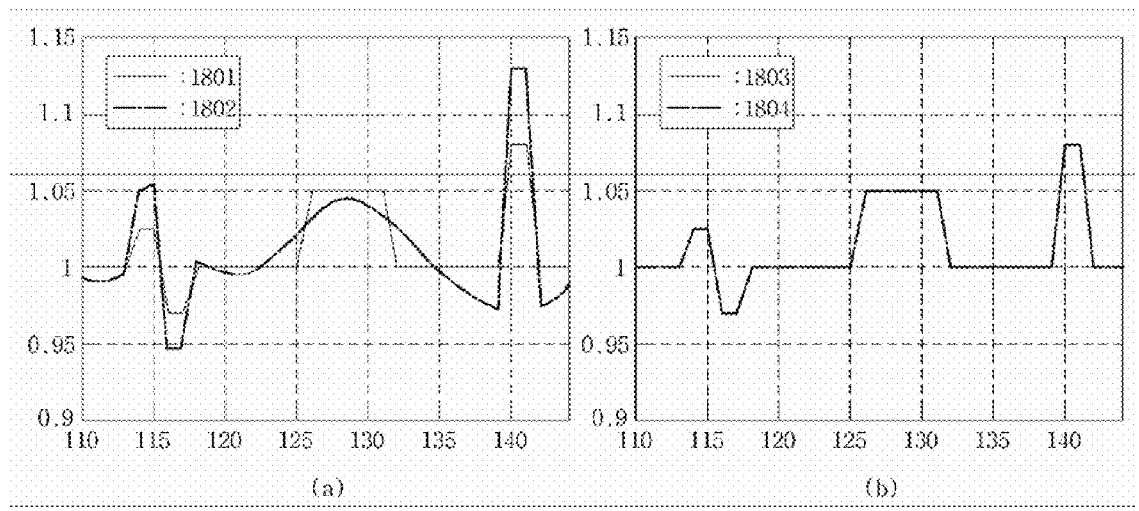
FIG. 18 is a view illustrating a result obtained by reconstructing the data of FIG. 17 using generalized series imaging and higher-order generalized series imaging.

FIG. 18 is a view illustrating a result obtained by reconstructing the data of FIG. 17 using generalized series imaging and higher-order generalized series imaging. In FIG. 18, 50 components among 256 Fourier components shown in FIG. 17 are shown in a central part.

In FIG. 18, a left graph (a) illustrates a result reconstructed by the generalized series imaging. A right graph (b) illustrates a result reconstructed by the higher-order generalized series imaging. A chain line 1802 1804 in the graph indicates a reconstructed signal, and a solid line 1801, 1803 thereof is an original dynamic signal for comparison.

As illustrated in the graph of FIG. 18, it is understood that a reconstruction by the higher-order generalized series imaging indicates the original dynamic signal well. That is, the higher-order generalized series imaging has a better performance than that of the generalized series imaging.

As apparent from the above description, in the imaging method of the present invention, high resolution photographing is possible through functional magnetic resonance image photographing related to the motions of hands Further, the present invention may obtain finer and more detailed results as compared with the conventional EPI.

Although embodiments in accordance with the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

What is claimed is:

1. A higher-order Generalized series parallel imaging method for acquiring high spatio-temporal resolution functional magnetic resonance images comprising:

performing restricted sampling of a central part of an input image in k-space, so as to acquire data with a rate lower than a Nyquist rate;

applying a high-order generalized series (HGS) reconstruction procedure to data acquired as the sampling result to acquire a first reconstructed image; and applying a parallel magnetic resonance reconstruction procedure to the first reconstructed image to acquire a second reconstructed image.

2. The method according to claim 1, wherein in a case that the sampling number is N when sampling is performed with the Nyquist rate, the sampling number $N_{tot}$ of the sampling step is expressed by $N_{tot}=N/R_{tot}$, $R_{tot}=R_{HGS}R_P$, $R_{HGS}=N/N_{GS}$ and $R_P=N/N_P$, where $N_{GS}$ and $N_P$ are, respectively, the sampling numbers when data are acquired by the generalized series imaging procedure and by the parallel magnetic resonance imaging procedure.

3. A higher-order generalized series parallel imaging method for acquiring high spatio-temporal resolution functional magnetic resonance images comprising:

performing restricted sampling of a central part of an input image in k-space, so as to acquire data with a rate lower than a Nyquist rate;

applying a parallel magnetic resonance reconstruction procedure to data acquired as the sampling result to acquire a first reconstructed image; and applying a high-order generalized series (HGS) reconstruction procedure to the first reconstructed image to acquire a second reconstructed image.

4. The method according to claim 1 or 3, wherein the step of applying the parallel magnetic resonance reconstruction procedure further includes performing regularization.

5. The method according to claim 1 or 3, wherein the step of applying the higher-order generalized series reconstruction procedure further includes performing regularization.

6. The method according to claim 1 or 3, wherein the parallel magnetic resonance imaging procedure is sensitivity profiles from an array of coils for encoding and reconstruction in parallel (SPACE RIP), sensitivity encoding (SENSE), partially parallel imaging with localized sensitivities (PILS), or generalized auto-calibrating partially parallel acquisitions (GRAPPA).

7. The method according to claim 3, wherein in a case that the sampling number is N when sampling is performed with the Nyquist rate, the sampling number $M_{tot}$ of the sampling step is expressed by $N_{tot}=N/R_{tot}$, $R_{tot}=R_{HGS}R_P$, $R_{HGS}=N/N_{GS}$ and $R_P=N/N_p$, where $N_{GS}$ and $N_P$ are, respectively, the sampling numbers when data are acquired by the generalized series imaging procedure and by the parallel magnetic resonance imaging procedure.

8. A method for acquiring magnetic resonance images comprising the steps of:

performing restricted sampling of a central part of an input image in the k-space so as to acquire data with a rate lower than a Nyquist rate;

applying firstly one of a generalized series reconstruction procedure or a parallel magnetic resonance reconstruction procedure to the acquired data to acquire a first reconstructed image; and applying secondly the other of a generalized series reconstruction procedure or a parallel magnetic resonance reconstruction procedure to the first reconstructed image to acquire a second reconstructed image.

9. The method according to claim 8, wherein when N denotes sampling at the Nyquist rate, the sampling number $N_{tot}$ of the sampling step is expressed by $N_{tot}=N/R_{tot}$, where $R_{rot}=R_{gsHGS} \cdot R_P$, $R_{HGS}=N/N_{GS}$ and $R_P=N/N_P$, and where $N_{GS}$ and $N_P$ are, respectively, the sampling numbers when data are acquired by the generalized series imaging procedure and by the parallel magnetic resonance imaging procedure.

* * * * *

UNITED STATES PATENT AND TRADEMARK OFFICE
CERTIFICATE OF CORRECTION

PATENT NO. : 8,232,800 B2
APPLICATION NO. : 12/508299
DATED : July 31, 2012
INVENTOR(S) : HyunWook Park et al.

Page 1 of 1

It is certified that error appears in the above-identified patent and that said Letters Patent is hereby corrected as shown below:

In the Claims:

Column 12, Claim 7, Line 51 should read as follows:
--...sampling number $N_{tot}$ of the sampling...--

Signed and Sealed this
Eighteenth Day of June, 2013

Teresa Stanek Rea
*Acting Director of the United States Patent and Trademark Office*